June 12, 1956 E. D. PADGETT 2,750,457

PULSE AMPLIFIER

Filed Feb. 2, 1953

INVENTOR.
Edward D. Padgett

BY Charles H. Brown
ATTORNEY

United States Patent Office 2,750,457

Patented June 12, 1956

2,750,457

PULSE AMPLIFIER

Edward D. Padgett, Haddonfield, N. J., assignor, by mesne assignments, to the United States of America as represented by the Secretary of the Air Force Application February 2, 1953, Serial No. 334,463

4 Claims. (Cl. 179—171)

This invention relates to wave translating circuits including means to prevent overshoot in the output wave, or to act on the overshoot to the exclusion of the input pulse.

The invention is useful in a variety of applications and is particularly useful in an amplifier for a pulse wave having a low repetition rate, such as 17 pulses per second, for example. In such an amplifier, the interstage coupling capacitors must be large in value to pass the fundamental frequency component. Being large in value, the coupling capacitors tend to hold a charge which causes an overshoot in the output pulse wave. A positive pulse is immediately followed by a negative overshoot and a negative pulse is immediately followed by a positive overshoot.

It is therefore an object of this invention to provide a pulse wave translating circuit wherein a pulse wave having a low pulse repetition rate may be acted upon with negligible overshoot.

The invention is also useful in an amplifier receptive to signals which differ greatly in amplitude. When a large signal is received, the vacuum tubes are overloaded, and they draw grid current which places a charge on the coupling capacitor. For a period immediately after the large signal, there is an overshoot effect on the grid and anode electrodes which makes the circuit insensitive to incoming signals. This dead time may result in the circuit being unable to pass desired intelligence.

It is therefore another object of this invention to provide a wave translating circuit capable of handling input signals which differ greatly in magnitude without the loss of intelligence immediately following receipt of a large signal.

As is known, the output wave of a vacuum tube circuit is reversed in polarity relative to the input wave. The designer of electronic equipment often starts with an input wave of a given amplitude and of a given polarity and he must provide an output wave of a given larger amplitude and of a given polarity. As often as not, the number of vacuum tubes sufficient to provide the required output amplitude turns out to be such that the polarity of the output signal is the opposite of that required. A polarity reversal may then be obtained by adding an otherwise unnecessary tube.

It is therefore a further object of this invention to provide a vacuum tube system including a diode which provides for a reversal in the polarity of the output signal without the addition of another vacuum tube.

In one aspect, the invention comprises a two-stage vacuum tube pulse amplifier circuit. A positive input pulse is applied through a coupling capacitor to the grid of the first tube, and the amplified negative output pulse on the anode of the first tube is applied through a coupling capacitor to the grid of the second tube. A positive output wave is available at the anode of the second tube. A grid resistor is connected from the grid of each tube to a point of reference potential such as ground. A diode which may be a germanium crystal diode, is coupled between the two grids, the diode being arranged to present a high impedance to current flow during the positive pulse on the grid of the first tube and the negative pulse on the grid of the second tube. The diode presents a low impedance to the following negative overshoot on the first grid and the positive overshoot on the grid of the second tube. The overshoots at two points in the circuit thus neutralize each other and the output pulse is substantially free of overshoot. If the input pulse is negative, the connections to the diode are reversed to provide the same cancellation of overshoot.

According to one aspect of the invention, if the connections to the diode are reversed from that providing the above result, the overshoot is amplified to the exclusion of the pulse, thereby to provide an output of polarity opposite from that obtained with conventional vacuum tube circuits.

These and other objects, aspects and features of the invention will be apparent to those skilled in the art from the following more detailed description taken together with the appended drawings, wherein.

Figure 1:
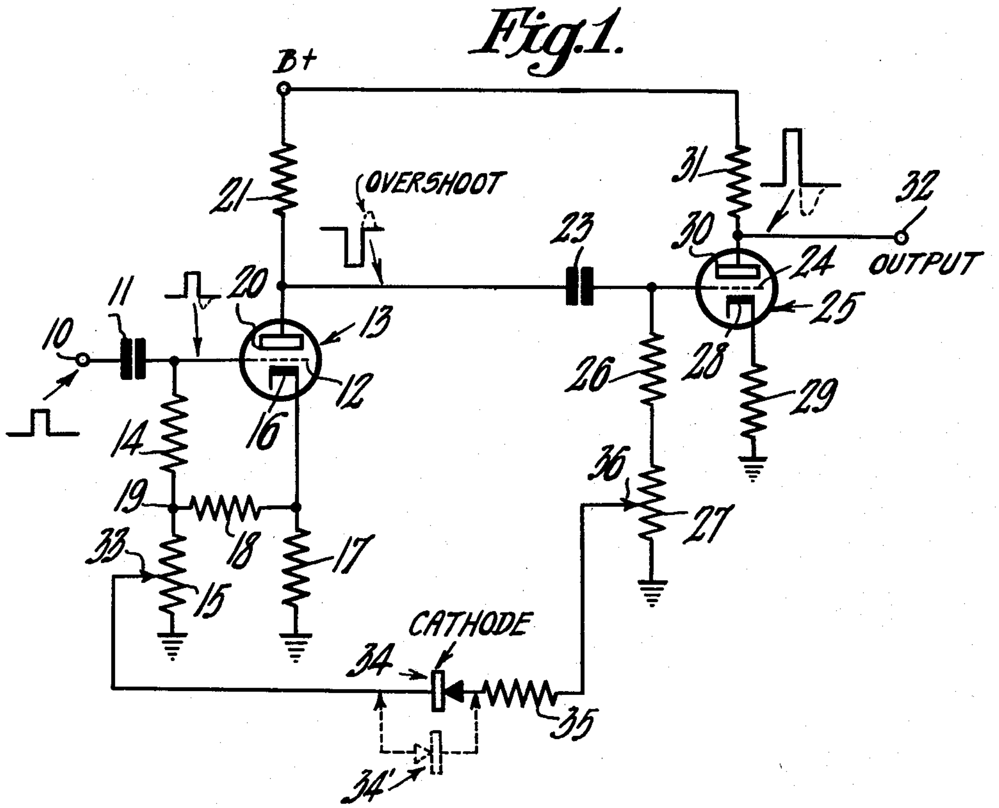
Fig. 1 is a circuit diagram of a pulse amplifier constructed according to the teachings of the invention.

In Fig. 1, a signal input terminal 10 is coupled through a capacitor 11 to the grid 12 of an amplifier electron discharge device or vacuum tube 13. Grid 12 is connected through a decoupling resistor 14 and grid resistor in the form of a potentiometer 15 to ground. Cathode 16 of tube 13 is connected through a cathode bias resistor 17 to ground and through a diode bias resistor 18 to a junction point 19 between resistor 14 and potentiometer 15.

The anode 20 of tube 13 is connected through anode resistor 21 to the B+ terminal of a source of unidirectional current. Anode 20 is also connected through coupling capacitor 23 to the grid 24 of an amplifier electron discharge device or vacuum tube 25. Grid 24 is connected through a decoupling resistor 26 and a grid resistor in the form of a potentiometer 27 to ground. Cathode 28 of tube 25 is connected through a cathode bias resistor 29 to ground. Anode 30 of tube 25 is connected through an anode resistor 31 to the B+ terminal of the source of unidirectional current. Anode 30 is also connected to an output terminal 32.

A tap 33 on the grid potentiometer 15 of tube 13 is connected through a high back-resistance diode 34 and a current limiting resistor 35 to a tap 36 on the grid potentiometer 27 of tube 25. Diode 34 may be a germanium diode or a vacuum tube diode.

In the operation of the circuit of Fig. 1, a positive pulse applied to input terminal 10 is amplified in the amplifier circuit including vacuum tube 13 and appears on anode 20 as a negative pulse. The amplified negative pulse is coupled to the grid 24 of vacuum tube 25 and appears on anode 30 and output terminal 32 as a further amplified positive pulse. These pulses are shown by solid-line waves adjacent the corresponding points at which they appear in the circuit of Fig. 1. When the pulse wave being amplified has a low repetition rate, such as 17 pulses per second, the coupling capacitors 11 and 23 must be large in value in order to pass the fundamental frequency component of the wave. Being large in value, coupling capacitor 11 tends to hold a charge for a short period after each positive pulse, and this charge makes grid 12 more negative than it otherwise would be. This results in a positive overshoot following each negative pulse on the anode 20 of tube 13. The negative pulse and positive overshoot are applied to grid 24 of vacuum tube 25 and appear on anode 30 as an amplified positive pulse with a negative overshoot. The negative overshoot is aggravated by the action of coupling capacitor 23 in the same manner as has been described in connection with coupling capacitor 11. These overshoots are represented by dotted lines on the waveforms in Fig. 1.

Overshoot in the output wave of tube 25 is substantially eliminated by means of a diode circuit coupled between the grid 12 of tube 13 and the grid 24 of tube 25. Diode 34, which may be a General Electric Type IN54 high-back-resistance crystal diode, is biased in the reverse direction, that is, in the direction having the greatest resistance to current flow. The bias is provided by taps 33 and 36 on potentiometers 15 and 27, respectively. Junction point 19 at the ungrounded end of potentiometer 15 is at a higher potential than the ungrounded end of potentiometer 27 by reason of the connection from cathode 16 through diode bias resistor 18 to junction point 19. A part of the positive potential developed across cathode resistor 17 by anode-to-cathode current in tube 13 is applied through diode bias resistor 18 to junction point 19. The amount of reverse bias applied to diode 34 may be adjusted by varying the positions of taps 33 and 36 on potentiometers 15 and 27, respectively. Resistor 35 is merely a current limiting resistor to protect the diode 34 from damage due to high currents.

Figure 2:
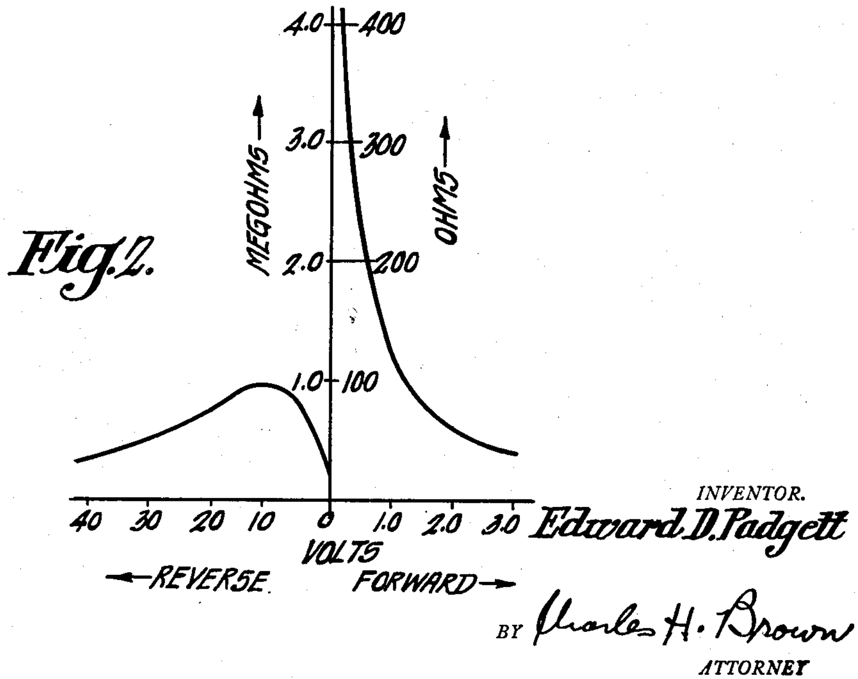
Fig. 2 is a characteristics chart of a typical germanium diode which will be used in explaining the operation of the circuit of Fig. 1.

Fig. 2 shows the resistance characteristics of a typical crystal diode when various values of voltage are applied. According to the present example, diode 34 is represented with an arrowhead pointing in the direction offering low resistance to current flow (as contrasted with electron flow). Since the cathode of diode 34 is connected to a more positive potential than the anode of the diode, diode 34 is biased in the reverse direction. By adjusting potentiometers 15 and 27, the reverse bias may be set to a desired value which may be in the order of 1.5 volts, depending on the amplitude of the signal pulse. As shown in Fig. 2, the resistance of the diode in the reverse direction may be in the order of hundreds of thousands of ohms. When a positive pulse is applied from input terminal 10 to grid 12 of tube 13, the voltage at tap 33 becomes more positive and the amplified negative pulse applied through coupling capacitor 23 to grid 24 of tube 25 causes the voltage at tap 36 to become more negative. The voltage across diode 34 is thus increased, but being in the reverse direction, there is only a slight increase in current through diode 34.

The positive pulse applied to coupling capacitor 11 leaves a negative charge (overshoot effect) on the side of capacitor 11 connected to grid 12, and the amplified negative overshoot pulse applied to coupling capacitor 23 leaves a positive charge on the side of capacitor 23 connected to grid 24. The polarity of the charges are such as to make the potential at tap 33 and the potential on the cathode of diode 34 more negative than it was, and to make the potential at tap 36 and the anode of diode 34 more positive than it was. The voltage across diode 34 is thus increased in the forward direction during the time of overshoot and the resistance of the diode in the forward direction is in the order of only a few hundred ohms. An increased current flows through the diode from anode to cathode thereby to cancel out the overshoot on the grid 12 of tube 13, and on the grid 24 of tube 25, and consequently on the anode 30 of tube 25.

Solely by way of illustration, a circuit like that shown in Fig. 1 was constructed using circuit elements with the following values:

| | | |
|---|---|---|
| Capacitors **11** and **23** | microfarads | 0.22 |
| Resistors **14** and **26** | megohms | 0.9 |
| Potentiometers **15** and **27** | do | 1.0 |
| Resistor **18** | do | 0.9 |
| Resistor **35** | do | 1.0 |
| Resistor **29** | ohms | 5000 |

A pulse wave having positive pulses with a width of 2.5 milliseconds and a pulse repetition rate of 17 pulses per second was amplified to provide an output wave substantially free of overshoot.

The circuit of Fig. 1 may be adapted to amplify a negative pulse wave applied to input terminal 10 by reversing the diode 34 in the circuit and transferring the diode bias resistor 18 in the bias network of tube 13 to a corresponding position in the bias network of tube 25. The taps 33 and 36 on potentiometers 15 and 27 are then readjusted to provide a proper reverse bias on diode 34. The circuit amplifies the pulse wave with negligible overshoot in the manner previously described.

The invention is also useful for the amplification of a pulse wave including pulses of very large and very small amplitude. If a very large pulse is immediately followed by a small pulse, the overshoot effect due to the large pulse often overloads the amplifier and the resulting overshoot effect causes the amplifier to be insensitive to the immediately following small pulse. Important intelligence thereby may be lost. This can be overcome by the use of a diode coupled between the grids as described above.

In another mode of operation wherein a positive pulse is applied to input terminal 10 and a negative output pulse is desired at output terminal 32 without the addition of another stage of amplification, the diode 34 is turned around so that the cathode is connected through limiting resistor 35 to tap 36 as shown by the dotted line connected to diode 34'. In this case, of course, the diode 34' as shown would replace diode 34 in the drawing. The diode 34' is then biased in the forward direction and the taps 33 and 36 are adjusted to provide a suitable bias potential across the diode. In this case the positive pulse on the grid 12 of tube 13 and the negative pulse on grid 24 of tube 25 cancel each other by current flow through the diode. However, the overshoot portions of the waves on the grids are of such a polarity that they cannot cancel each other by current flow through the diode. The output pulse at terminal 32 is a negative pulse which is an amplified version of the overshoot. The output pulse has the desired negative polarity and is slightly delayed relative to the input pulse.

If a negative pulse is applied to input terminal 10 and a positive pulse is desired at output terminal 32, the diode is connected with the polarity shown in Fig. 1.

It should be understood that while the invention has been illustrated in the form of a two-stage amplifier, it is applicable to circuits with any desired number of stages.

What is claimed is:

1. A wave translating system comprising first and second electron discharge devices each including cathode, grid and anode electrodes, resistors in circuit with said grid and cathode electrodes, means to apply a wave to the grid electrode of said first device, means to couple the anode electrode of said first device to the grid electrode of said second device, a resistor connected between the cathode electrode and a point intermediate the ends of the grid resistor of said first device, and a diode coupled between intermediate points on the grid resistors of said first and second devices.

2. A pulse amplifier, comprising, first and second electron discharge devices each including cathode, grid and anode electrodes, resistors in circuit with each of said grid and cathode electrodes, means to couple the anode electrode of said first device to the grid electrode of said second device, a resistor connected between the cathode electrode of said first device and a point intermediate the ends of the grid resistor of said first device, a coupling capacitor connected to the grid electrode of said first device thru which an input pulse is applied, and means to neutralize the effect of a charge stored on said coupling capacitor during the application there-thru of a pulse comprising a diode coupled between intermediate points on the grid resistors of said first and second devices.

3. A pulse amplifier as defined in claim 2 and in addition, a current limiting resistor connected in series with said diode between said intermediate points on the grid resistors of said first and second devices.

4. An amplifier for a pulse wave having a very low repetition rate comprising, an input terminal, first and second vacuum tubes each having cathode, grid and anode electrodes, a first coupling capacitor between said input terminal and the grid of said first tube, a second capacitor between the anode of said first tube and the grid of said second tube, said coupling capacitors having a high value of capacitance to pass the low repetition rate pulses and consequently introducing undesired overshoot immediately following each pulse and of opposite polarity to the respective pulse, first and second grid resistors connected from respective ones of said grids to points of reference potential, a diode and at least one resistor connected in series from an intermediate point on said second grid resistor to a point on said first grid resistor, said diode being poled to be non-conductive during said pulses but conductive during said overshoot following each input pulse, said resistors having values and said series circuit being connected to points on said grid resistors so selected that said pulses are substantially unaffected but the overshoot following each of said input pulses is substantially completely cancelled.

References Cited in the file of this patent

UNITED STATES PATENTS

| | | |
|---|---|---|
| 2,254,114 | Wilson | Aug. 26, 1941 |
| 2,532,347 | Stodola | Dec. 5, 1950 |
| 2,537,958 | Berman | Jan. 16, 1951 |
| 2,557,636 | Crumrine | June 19, 1951 |
| 2,563,052 | MacSorley | Aug. 7, 1951 |

FOREIGN PATENTS

| | | |
|---|---|---|
| 541,272 | Great Britain | Nov. 20, 1941 |
| 122,002 | Australia | Aug. 29, 1946 |